United States Patent
Hung et al.

(10) Patent No.: US 9,324,610 B2
(45) Date of Patent: Apr. 26, 2016

(54) METHOD FOR FABRICATING SEMICONDUCTOR DEVICE

(71) Applicant: UNITED MICROELECTRONICS CORP., Hsin-Chu (TW)

(72) Inventors: Ching-Wen Hung, Tainan (TW); Jia-Rong Wu, Kaohsiung (TW); Tsung-Hung Chang, Yunlin County (TW); Ching-Ling Lin, Kaohsiung (TW); Yi-Hui Lee, Taipei (TW); Chih-Sen Huang, Tainan (TW); Yi-Wei Chen, Taichung (TW); Chun-Hsien Lin, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/455,939

(22) Filed: Aug. 10, 2014

(65) Prior Publication Data

US 2016/0013104 A1   Jan. 14, 2016

(30) Foreign Application Priority Data

Jul. 8, 2014   (TW) .............................. 103123508 A

(51) Int. Cl.
| | | |
|---|---|---|
| *H01L 21/02* | (2006.01) | |
| *H01L 21/768* | (2006.01) | |
| *H01L 29/78* | (2006.01) | |
| *H01L 23/535* | (2006.01) | |
| *H01L 29/66* | (2006.01) | |
| *H01L 23/485* | (2006.01) | |
| *H01L 23/532* | (2006.01) | |

(52) U.S. Cl.
CPC ........ *H01L 21/76897* (2013.01); *H01L 23/485* (2013.01); *H01L 23/535* (2013.01); *H01L 29/665* (2013.01); *H01L 29/785* (2013.01); *H01L 23/53266* (2013.01)

(58) Field of Classification Search
CPC ...................................... H01L 29/665
USPC ............. 257/382, 456; 438/630, 649, 664
See application file for complete search history.

(56) References Cited

U.S. PATENT DOCUMENTS

| | | | |
|---|---|---|---|
| 5,937,325 A | 8/1999 | Ishida | |
| 5,998,873 A * | 12/1999 | Blair ..................... | H01L 23/485 257/753 |
| 7,101,791 B2 * | 9/2006 | Jin ........................ | H01L 21/743 257/E21.165 |
| 8,536,010 B2 * | 9/2013 | Nieh ..................... | H01L 29/665 438/301 |
| 2003/0119309 A1 * | 6/2003 | Ryoo ................ | H01L 21/28518 438/649 |
| 2004/0192026 A1 * | 9/2004 | Chen ................. | H01L 21/76855 438/629 |
| 2005/0104091 A1 * | 5/2005 | Tabery .............. | H01L 29/66818 257/213 |
| 2006/0141721 A1 * | 6/2006 | Lee ........................ | H01L 29/665 438/299 |
| 2008/0090369 A1 * | 4/2008 | Akiyama .......... | H01L 21/28518 438/308 |
| 2009/0020757 A1 * | 1/2009 | Lo ..................... | H01L 21/26506 257/57 |
| 2011/0248355 A1 * | 10/2011 | Futase ............... | H01L 21/28052 257/383 |

* cited by examiner

*Primary Examiner* — David Vu
*Assistant Examiner* — Brandon Fox
(74) *Attorney, Agent, or Firm* — Winston Hsu; Scott Margo

(57) ABSTRACT

A method for fabricating semiconductor device is disclosed. The method includes the steps of: providing a substrate having at least one metal gate thereon, a source/drain region adjacent to two sides of the at least one metal gate, and an interlayer dielectric (ILD) layer around the at least one metal gate; forming a plurality of contact holes in the ILD layer to expose the source/drain region; forming a first metal layer in the contact holes; performing a first thermal treatment process; and performing a second thermal treatment process.

18 Claims, 4 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method of conducting two thermal processes for forming silicide after forming contact holes.

2. Description of the Prior Art

Field effect transistors are important electronic devices in the fabrication of integrated circuits, and as the size of the semiconductor device becomes smaller and smaller, the fabrication of the transistors also improves and is constantly enhanced for fabricating transistors with smaller sizes and higher quality.

In the conventional method of fabricating transistors, a gate structure is first formed on a substrate, and a lightly doped drain (LDD) is formed on the two corresponding sides of the gate structure. Next, a spacer is formed on the sidewall of the gate structure and an ion implantation process is performed to form a source/drain region within the substrate by utilizing the gate structure and spacer as a mask. In order to incorporate the gate, source, and drain into the circuit, contact plugs are often utilized for interconnection purposes, in which the contact plugs are composed of conducting metals such as tungsten and copper. Nevertheless, the interconnection between the contact plugs and the silicon material of the gate structure and the source/drain region is usually poor, hence a silicide material is often formed over the surface of the gate structure and the source/drain region to improve the ohmic contact between the contact plugs and the gate structure and the source/drain region.

Nevertheless, current approach for forming silicide still encounters numerous problems. Hence, how to improve the current fabrication process while increasing the performance of the device has become an important task in this field.

SUMMARY OF THE INVENTION

A method for fabricating semiconductor device is disclosed. The method includes the steps of: providing a substrate having at least one metal gate thereon, a source/drain region adjacent to two sides of the at least one metal gate, and an interlayer dielectric (ILD) layer around the at least one metal gate; forming a plurality of contact holes in the ILD layer to expose the source/drain region; forming a first metal layer in the contact holes; performing a first thermal treatment process; and performing a second thermal treatment process.

According to another aspect of the present invention, a semiconductor device is disclosed. The semiconductor device includes a substrate; a metal gate on the substrate; a source/drain region adjacent to the metal gate in the substrate; an interlayer dielectric (ILD) layer on the substrate and around the metal gate; a plurality of contact plugs electrically connected to the source/drain region; and a silicide between the contact plugs and the source/drain region. Preferably, the silicide comprises a C54 phase structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
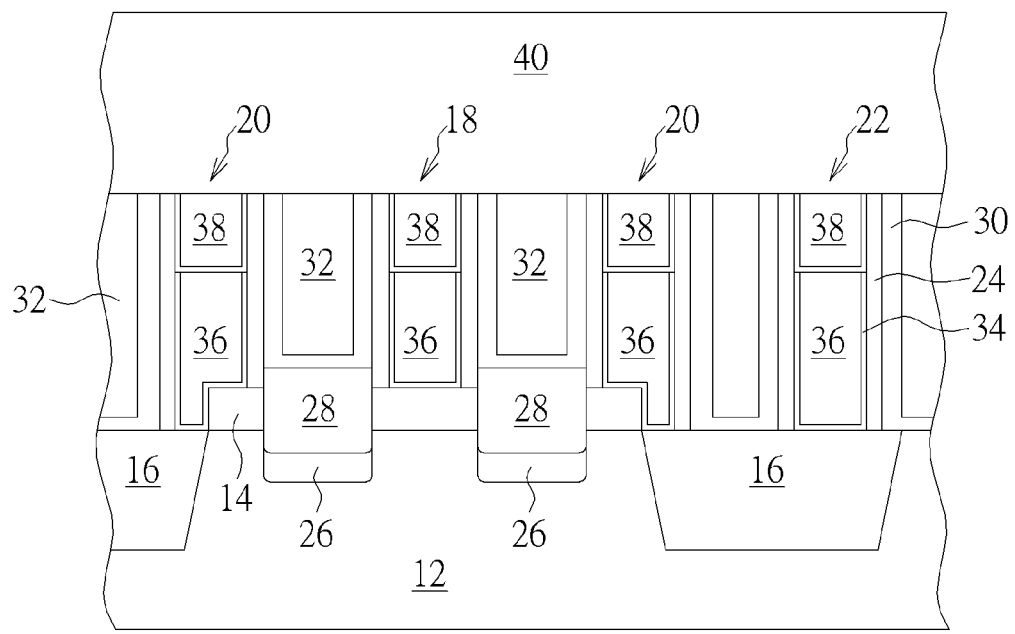
FIGS. 1-8 illustrate a method for fabricating semiconductor device according to a preferred embodiment of the present invention.

Referring to FIGS. 1-8, FIGS. 1-8 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as a PMOS region or a NMOS region is defined on the substrate 12.

At least a first fin-shaped structure 14 and an insulating layer 16 are formed on the substrate 12, in which the bottom of the fin-shapes structure 14 is preferably enclosed by the insulating layer 16, such as silicon oxide to form a shallow trench isolation (STI). A metal gate 18 and a plurality of selective metal gates 20 are formed on part of the fin-shaped structure 14. In the transistor device formed afterwards, the overlapped region between the fin-shaped structure 14 and the metal gate 18 could be used as a channel for carrier flow. In addition to the metal gates 18 and 20 situating atop the fin-shaped structure 14, addition metal gate 22 belonging to other MOS transistor could also be fabricated on the insulator 16.

The formation of the fin-shaped structure 14 could include first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer 16 surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer 16 to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer 16 could be eliminated.

The fabrication of the metal gates 18, 20, 22 could be accomplished by first forming dummy gates (not shown) composed of high-k dielectric layer and polysilicon material on the fin-shaped structure 14 and the insulating layer 16, forming a spacer on the sidewalls of the dummy gates, forming a source/drain region 26 and epitaxial layer 28 in the fin-shaped structure 14 adjacent to two sides of the spacer 24 and/or the substrate 12, forming a contact etch stop layer (CESL) 30 covering the dummy gates, and forming an interlayer dielectric (ILD) layer 32 on the CESL 30.

Next, a replacement metal gate (RMG) process could be conducted to planarize part of the ILD layer 32 and CESL 30 and then transforming the dummy gate into a metal gate. The RMG process could be accomplished by first performing a selective dry etching or wet etching process, such as using etchants including ammonium hydroxide (NH$_4$OH) or tetramethylammonium hydroxide (TMAH) to remove the polysilicon layer from dummy gate for forming a recess (not shown) in the ILD layer 32. Next, a conductive layer including at least a U-shaped work function metal layer 34 and a low resistance metal layer 36 is formed in the recess, and a planarizing process is conducted to form the metal gates 18, 20, and 22.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

After forming the metal gates 18, 20, 22, part of the work function metal layer 34 and low resistance metal layer 36 could be removed, and a hard mask 38 is formed on the work function metal layer 34 and the low resistance metal layer 36. The hard mask 38 could be a single material layer or composite material layer, such as a composite layer containing both silicon oxide and silicon nitride. After performing a planarizing process, a dielectric layer 40, such as a pre-metal dielectric (PMD) layer is deposited on the ILD layer 32 and covering the metal gates 18, 20, and 22.

Figure 2:
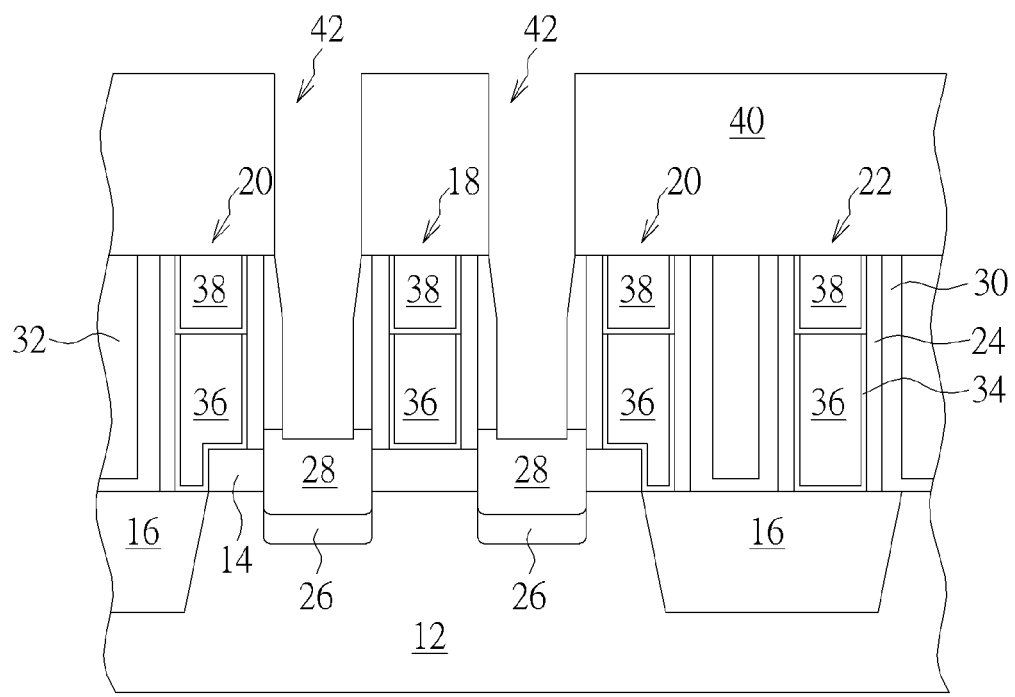

Next, as shown in FIG. 2, a photo-etching process is conducted by first forming a patterned resist (not shown) on the dielectric layer 40, and an etching process is conducted to remove part of the dielectric layer 40 and part of the ILD layer 32 adjacent to two sides of the metal gate 18 for forming a plurality of contact holes 42 exposing the epitaxial layer 28 atop the source/drain region 26. In this embodiment, the aforementioned photo-etching process conducted in FIG. 2 to form contact plugs electrically connected to source/drain region 26 is referred to as a MOCT patterning process.

Figure 3:
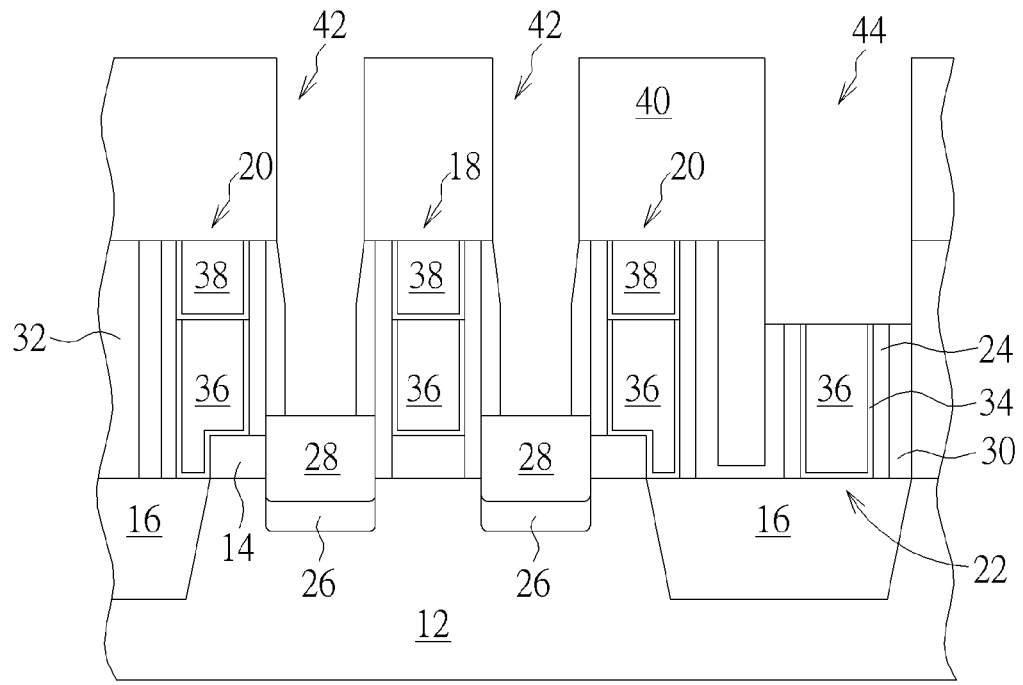

Next, as shown in FIG. 3, another photo-etching process is conducted by first forming a patterned resist (not shown) on the dielectric layer 40, and an etching process is conducted to remove part of the dielectric layer 40, part of the ILD layer 32, and the hard mask 38 above the metal gate 22 for forming a contact hole 44 exposing the surface of the metal gate 22. In this embodiment, the aforementioned photo-etching process conducted in FIG. 3 to form contact plugs electrically connected to the metal gate 22 is referred to as a MOPY patterning process.

Figure 4:
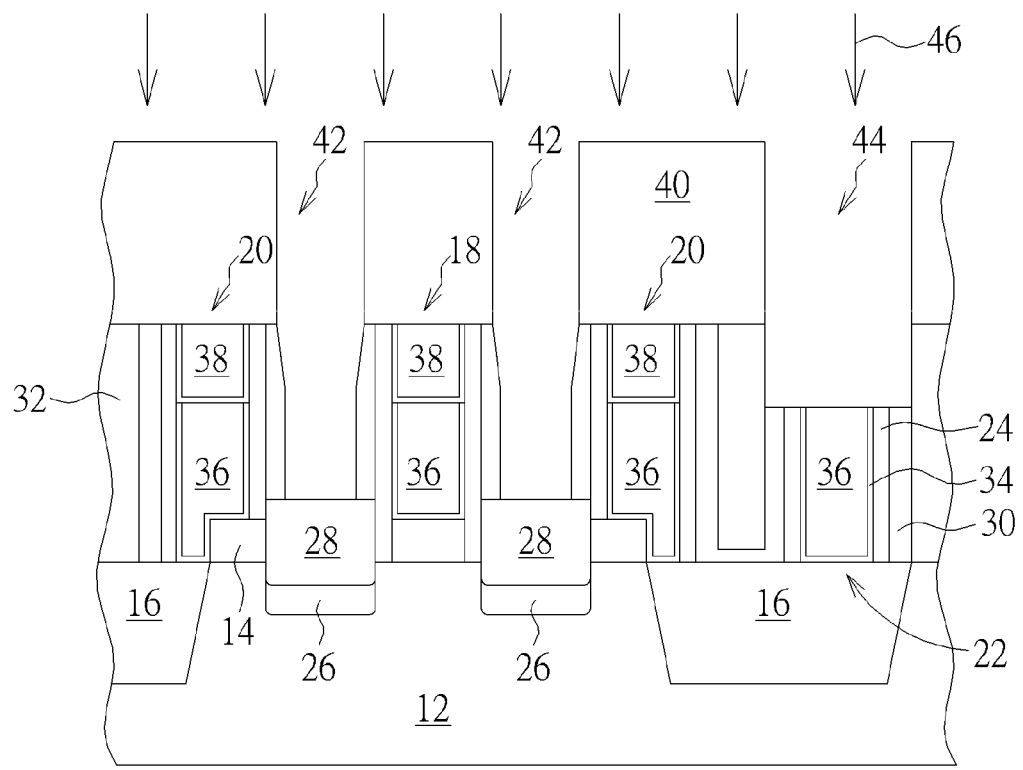

After the aforementioned double patterning and double etching (2P2E) process used to form contact holes 42 and 44 is completed, as shown in FIG. 4, a pre-clean process 46 is conducted to remove remaining particles left from the aforementioned photo-etching processes.

Figure 5:
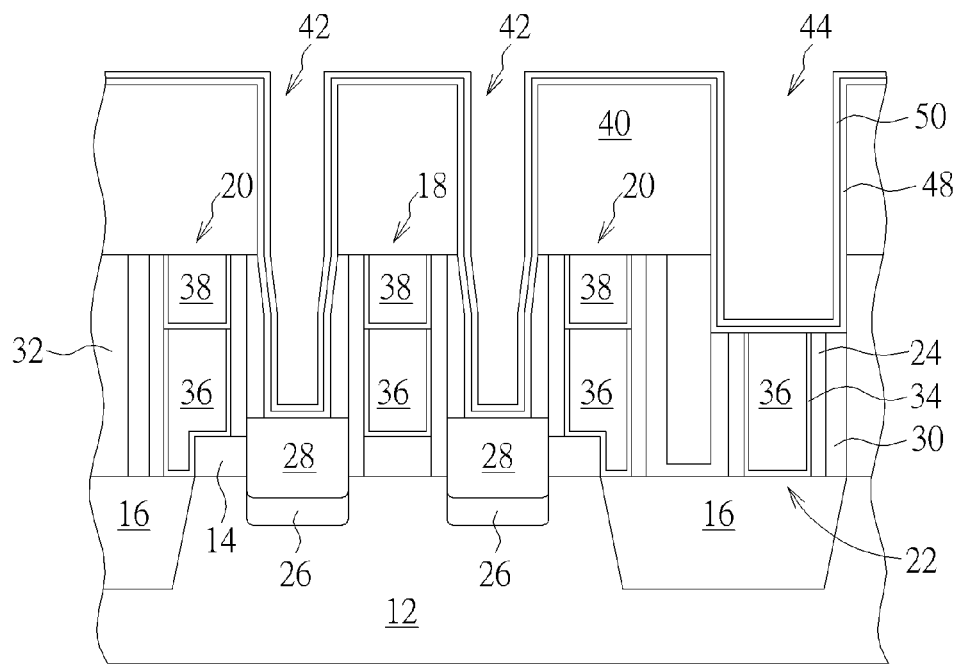

Next, as shown in FIG. 5, a first metal layer 48 and a second metal layer 50 are deposited in sequence in the contact holes 42 and 44, in which the first metal layer 48 and the second metal layer 50 are formed conformally on the surface of the dielectric layer 40 and the epitaxial layer 28 and the inner sidewalls of the contact holes 42 and 44. In this embodiment, the first metal layer 48 is selected from the group consisting of Ti, Co, Ni, and Pt, and most preferably Ti, and the second metal layer 50 is selected from the group consisting of TiN and TaN.

Figure 6:
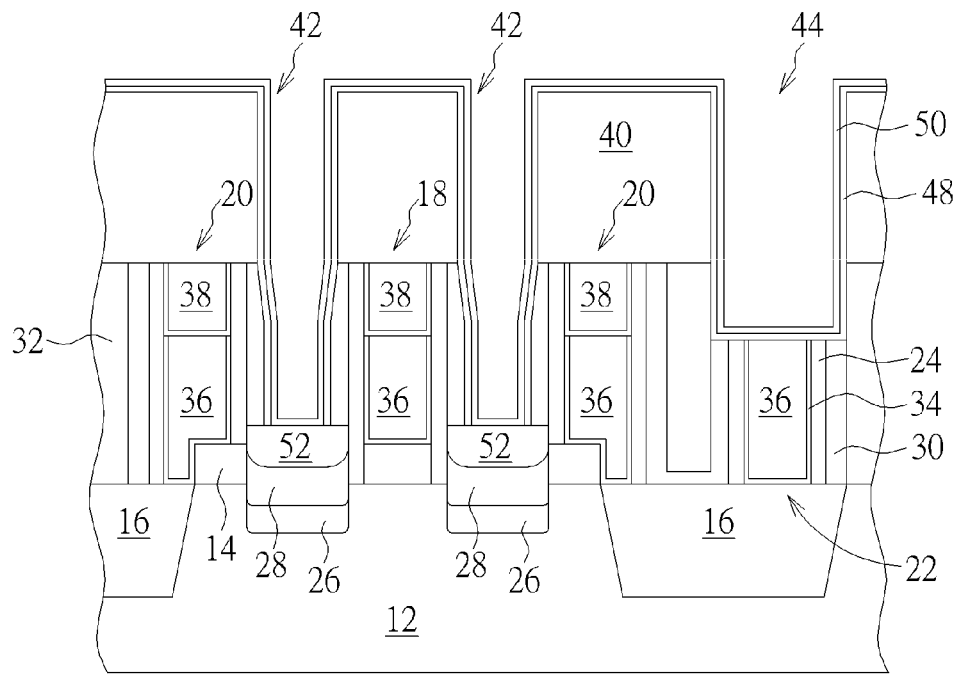

After depositing the first metal layer 48 and second metal layer 50, as shown in FIG. 6, a first thermal treatment process and a second thermal treatment process are conducted sequentially to form a silicide 52 on the epitaxial layer 28. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

Figure 7:
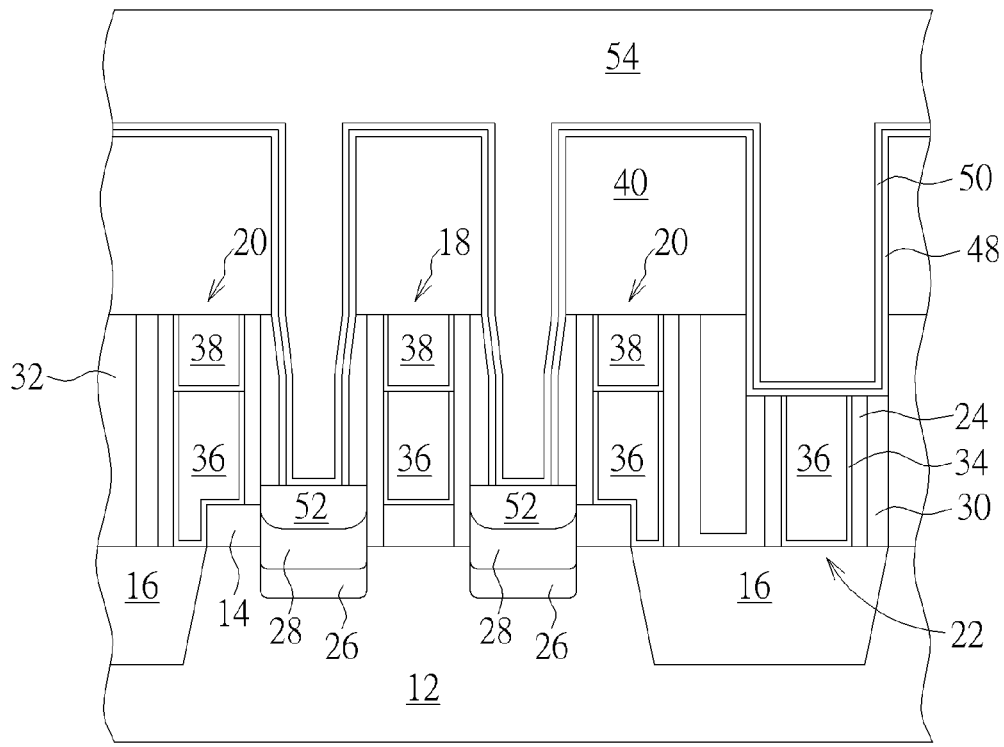

After the two thermal treatment processes are conducted, as shown in FIG. 7, a third metal layer 54 is deposited to fully fill the contact holes 42 and 44. In this embodiment, the third metal layer 54 is composed of tungsten, but not limited thereto.

Figure 8:
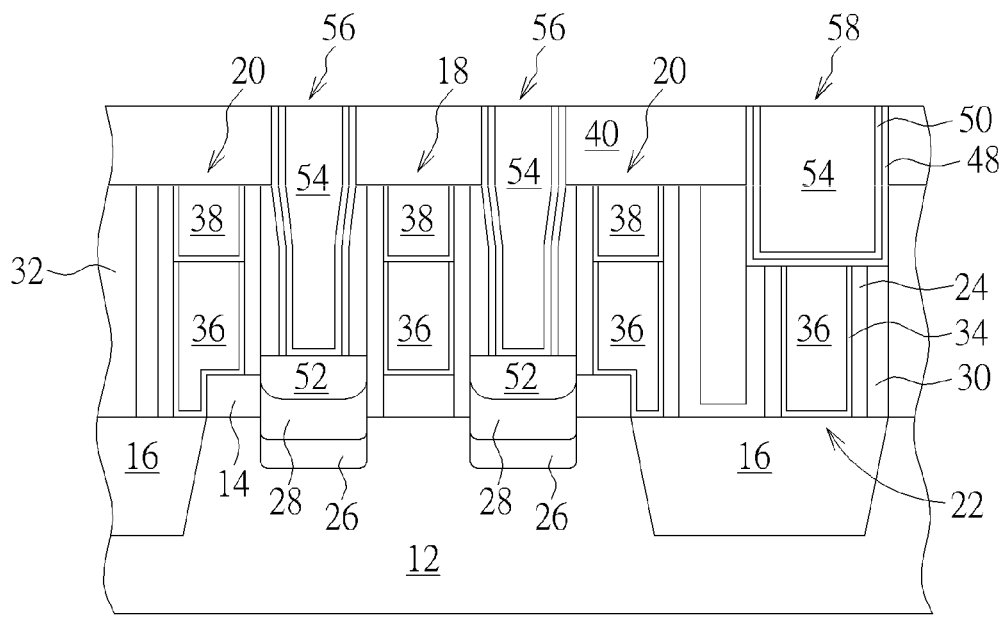

Next, as shown in FIG. 8, a planarizing process, such as a CMP process is conducted to remove part of the third metal layer 54, part of the second metal layer 50, and part of the first metal layer 48, and depending on the demand of the process also removing part of the dielectric layer 40 for forming a plurality of contact plugs 56 electrically connected to the source/drain region 26 and contact plug 58 electrically connected to the metal gate 22. This completes the fabrication of a FinFET device according to a preferred embodiment of the present invention.

Preferably, the two thermal treatment processes conducted in FIG. 6 transforms the first metal layer 48 into a silicide 52. More specifically, the first thermal treatment process preferably transforms the portion of the first metal layer 48 contacting the epitaxial layer 28 into a TiSi$_2$ silicide having C49 phase structure, and the second thermal treatment process then transforms the silicide having C49 phase structure into a silicide with lower resistance and having C54 phase structure. It should be noted that because only the portion of the first metal layer 48 directly contacting the epitaxial layer 28 is transformed into silicide 52, or that the first metal layer 48 in the bottom of the contact holes 42 is completely turned into silicide 52, the other part of the first metal layer 48 without contacting the epitaxial layer 28 would not be transformed into silicide 52 after the aforementioned two thermal treatment processes and would still be remained on the sidewalls of the contact holes 42 and 44. Similarly, the first metal layer 48 contacting the metal gate 22 in the contact hole 44 would not be transformed into silicide 52 after the two thermal treatment processes and would still be remained in its original metal layer form.

Moreover, it should also be noted that since the second metal layer 50 is utilized to prevent metal ions within the third metal layer 54 from diffusing into the surrounding material layer while increasing the adhesion between the third metal layer 54 and the dielectric layer 40, the second metal layer 50 is not transformed into silicide 52 throughout the process. Structurally, the second metal layer 50 is disposed on the silicide 52 and the un-reacted first metal layer 48 on the sidewalls of the contact holes 42 and 44.

Referring again to FIG. 8, which further illustrates a perspective view of a semiconductor device. Preferably the semiconductor device includes a substrate 12, at least a metal gate 18 on the substrate 12, a fin-shaped structure 14 between the substrate 12 and the metal gate 18, a source/drain region 26 in the substrate 12 adjacent to the metal gate 18, an interlayer dielectric (ILD) layer 32 on the substrate 12 and around the metal gate 18, a plurality of contact plugs 56 electrically connected to the source/drain region 26, and a silicide 52 between the contact plugs 56 and the source/drain region 26. According to a preferred embodiment of the present invention, the silicide 52 includes a C54 phase structure, and the contact plug 58 directly contacting the metal gate 22 preferably includes two layers of intact first metal layer 48 and second metal layer 50.

The semiconductor device further includes an epitaxial layer 28 between the silicide 52 and source/drain region 26, the contact plugs 56 includes a first metal layer 48 surrounding a second metal layer 50 and a third metal layer 54, and the second metal layer 50 preferably contacts the silicide 52 directly. In this embodiment, the first metal layer 48 is selected from the group consisting of Ti, Co, Ni, and Pt, the second metal layer 50 is composed of TiN, and the third metal layer 54 is composed of tungsten (W), and not limited thereto.

Overall, the FinFET process of the present invention sequentially performs two thermal treatment processes after forming metal gate and contact holes to transforms the metal gate layer in the contact holes into silicide. Specifically, after contact holes are formed, a first metal layer and a second metal layer are deposited into the contact holes, and then a first thermal treatment process is conducted to transform the first metal layer directly contacting silicon-containing regions such as epitaxial layer or source/drain region into a silicide with C49 phase structure. Next, a second thermal treatment process is conducted thereafter to turn the already formed silicide into silicide with lower resistance, such as silicide with C54 phase structure. Next, a third metal layer is deposited into the contact holes without removing any un-reacted first metal layer, and part of the third metal layer, part of the second metal layer, and part of the first metal layer are removed through CMP process to form a plurality of contact plugs electrically connecting the source/drain region and metal gate.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having at least one metal gate thereon, a source/drain region adjacent to two sides of the at least one metal gate, a contact etch stop layer (CESL) around the at least one metal gate, and an interlayer dielectric (ILD) layer around the at least one metal gate, wherein the metal gate comprises a work function metal layer and a low resistance metal layer;
   removing part of the ILD layer to form a plurality of contact holes exposing the source/drain region, the CESL, and the metal gate;
   forming a first metal layer and a second metal layer in the contact holes, wherein the first metal layer contacts the CESL directly;
   performing a first thermal treatment process after forming the first metal layer and the second metal layer; and
   performing a second thermal treatment process to form a silicide on the source/drain region while no silicide is formed on the metal gate.

2. The method of claim 1, further comprising:
   forming a fin-shaped structure on the substrate; and
   forming the at least one metal gate on the fin-shaped structure.

3. The method of claim 1, wherein the first thermal treatment process comprises a soak anneal process, and the second thermal treatment process comprises a spike anneal process.

4. The method of claim 1, wherein the temperature of the first thermal treatment process is between 500° C. to 600° C.

5. The method of claim 1, wherein the temperature of the second thermal treatment process is between 600° C. to 950° C.

6. The method of claim 1, wherein the duration of the first thermal treatment process is between 10 seconds to 60 seconds.

7. The method of claim 1, wherein the duration of the second thermal treatment process is between 100 milliseconds to 5 seconds.

8. The method of claim 1, further comprising forming a second metal layer after forming the first metal layer.

9. The method of claim 8, wherein the first metal layer is selected from the group consisting of Ti, Co, Ni, and Pt, and the second metal layer comprises TiN.

10. The method of claim 8, further comprising:
    forming an epitaxial layer on the source/drain region;
    forming a dielectric layer on the ILD layer;
    forming the contact holes in the dielectric layer and the ILD layer;
    forming the first metal layer and the second metal layer in the contact holes;
    performing the first thermal treatment process and the second thermal treatment process for forming the silicide on the epitaxial layer;
    forming a third metal layer to fill the contact holes; and
    performing a planarizing process to partially remove the third metal layer, the second metal layer, and the first metal layer.

11. The method of claim 10, wherein the third metal layer comprises tungsten.

12. The method of claim 10, wherein the silicide comprises a C54 phase structure.

13. The method of claim 1, further comprising performing a pre-clean process before forming the first metal layer.

14. A semiconductor device, comprising:
    a substrate;
    a metal gate on the substrate;
    a contact etch stop layer (CESL) around the metal gate;
    a source/drain region adjacent to the metal gate in the substrate;
    an interlayer dielectric (ILD) layer on the substrate and around the metal gate;
    a plurality of contact plugs electrically connected to the source/drain region and the metal gate, wherein each of the contact plugs comprises a first metal layer surrounding a second metal layer and a third metal layer; and a silicide between the contact plugs and the source/drain region, wherein the silicide comprises a C54 phase structure and the CESL, the first metal layer, the second metal layer, and the third metal layer are all disposed on the silicide, and two sides of the silicide are aligned with two edges of the CESL.

15. The semiconductor device of claim 14, further comprising a fin-shaped structure between the substrate and the metal gate.

16. The semiconductor device of claim 14, further comprising an epitaxial layer between the silicide and the source/drain region.

17. The semiconductor device of claim 14, wherein the second metal layer directly contacts the silicide.

18. The semiconductor device of claim 14, wherein the first metal layer is selected from the group consisting of Ti, Co, Ni, and Pt, the second metal layer comprises TiN, and the third metal layer comprises W.

* * * * *